United States Patent [19]

Uchiyama et al.

[11] Patent Number: 5,175,545
[45] Date of Patent: Dec. 29, 1992

[54] DATA CODING SYSTEM IN A MAGNETIC RECORDING APPARATUS

[75] Inventors: Takamasa Uchiyama; Tadahiko Kameyama, both of Odawara, Japan

[73] Assignee: Hitachi, Ltd., Tokyo, Japan

[21] Appl. No.: 298,118

[22] Filed: Jan. 17, 1989

[30] Foreign Application Priority Data

Jan. 18, 1988 [JP] Japan .................................. 63-6827
Jul. 8, 1988 [JP] Japan ................................ 63-169066

[51] Int. Cl.$^5$ ........................................... H03M 7/00
[52] U.S. Cl. ......................................... 341/59; 341/67; 360/40
[58] Field of Search ...................... 341/59, 67; 360/39, 360/40

[56] References Cited

U.S. PATENT DOCUMENTS

| | | | |
|---|---|---|---|
| 4,413,251 | 11/1983 | Adler et al. | 341/59 |
| 4,463,344 | 7/1984 | Adler et al. | 341/59 |
| 4,484,176 | 11/1984 | Fitzpatrick | 341/59 |
| 4,488,142 | 12/1984 | Franaszek | 341/59 |
| 4,684,921 | 8/1987 | Fok et al. | 341/59 |
| 4,688,016 | 8/1987 | Fok | 341/59 |
| 4,866,544 | 9/1989 | Hashimoto | 360/40 |
| 4,868,922 | 9/1989 | Tsuji et al. | 360/40 |
| 4,881,076 | 11/1989 | Ashley et al. | 341/95 |
| 4,914,438 | 4/1990 | Kameyama | 341/59 |

FOREIGN PATENT DOCUMENTS

48-7641 1/1973 Japan .
58-119273 7/1983 Japan .

Primary Examiner—Marc Hoff
Attorney, Agent, or Firm—Kenyon & Kenyon

[57] ABSTRACT

A digital code conversion system in a magnetic recording apparatus for converting one bit of an input digital signal into a signal of two bits, in which the number of binary digits of "0" making appearance between adjacent binary digits of "1" is two at minimum and seven at maximum. In the digital code resulting from the code conversion, ratio between maximum and minimum values of the density at which the binary digit of "1" makes appearance is 1:2.

24 Claims, 5 Drawing Sheets

FIG. 1(A) PRIOR ART
6-1-1-6 PATTERN

CODE WORD : 1000000 1010 10000000 1

FIG. 1(B) PRIOR ART
7-1-1-7 PATTERN

CODE WORD : 10000000 1010 10000000 1

FIG. 2(A)

(BIT RATE 1:2)

| CODED DATA (6 BITS) | | CURRENT STATE (4 BITS) | INPUT DATA (ORIGINAL DATA) (3 BIT) | | | | | | | |
|---|---|---|---|---|---|---|---|---|---|---|
| | | | 000 | 001 | 010 | 011 | 100 | 101 | 110 | 111 |
| a | 000001 | A(0000) | A/a | B/a | E/a | H/a | K/a | E/h | H/h | K/h |
| b | 001001 | B(0001) | A/b | B/b | E/b | H/b | K/b | N/b | H/k | K/k |
| c | 010001 | C(0010) | A/c | B/c | E/c | H/c | K/c | N/c | H/l | K/l |
| d | 100001 | D(0011) | A/d | B/d | E/d | H/d | K/d | N/d | H/j | K/j |
| e | 000010 | E(0100) | A/e | B/e | C/e | E/e | F/e | H/e | K/e | L/e |
| f | 010010 | F(0101) | A/f | B/f | C/f | E/f | F/f | H/f | K/f | L/f |
| g | 100010 | G(0110) | A/g | B/g | C/g | E/g | F/g | H/g | K/g | L/g |
| h | 000100 | H(0111) | B/h | C/h | D/h | F/h | G/h | J/h | L/h | M/h |
| j | 100100 | J(1000) | B/j | C/j | D/j | F/j | G/j | J/j | L/j | M/j |
| k | 001000 | K(1001) | B/k | C/k | D/k | F/k | G/k | J/k | L/k | M/k |
| l | 010000 | L(1010) | B/l | C/l | D/l | F/l | G/l | J/l | L/l | M/l |
| m | 100000 | M(1011) | K/m | C/m | D/m | F/m | G/m | J/m | L/m | M/m |
| n | 000000 | N(1100) | E/k | C/n | D/n | F/n | G/n | J/n | L/n | M/n |

FIG. 2(B)

NEXT-STATE SIGNAL X' / CODED DATA

(BIT RATE 2:3)

| CODED DATA (6 BITS) | | CURRENT STATE (5 BITS) | INPUT DATA (ORIGINAL DATA) (4 BITS) | | | | | | | | | | | | | | | | |
|---|---|---|---|---|---|---|---|---|---|---|---|---|---|---|---|---|---|---|---|
| | | | 0000 | 0001 | 0010 | 0011 | 0100 | 0101 | 0110 | 0111 | 1000 | 1001 | 1010 | 1011 | 1100 | 1101 | 1110 | 1111 |
| a | 000000 | A (00000) | E/a | F/a | R/b | H/a | J/a | M/a | N/a | P/a | R/a | S/a | U/a | V/a | W/a | E/k | F/k | G/k |
| b | 000001 | B (00001) | A/b | B/b | C/b | D/b | E/b | G/b | K/b | L/b | M/b | Q/b | B/q | T/b | V/b | C/q | D/q | E/q |
| c | 000101 | C (00010) | A/c | B/c | C/c | D/c | E/c | G/c | K/c | L/c | M/c | Q/c | R/c | T/c | B/l | C/l | D/l | W/m |
| d | 001001 | D (00011) | A/d | B/d | C/d | D/d | E/d | G/d | K/d | L/d | M/d | Q/d | R/d | T/d | V/d | C/t | D/t | E/t |
| e | 010001 | E (00100) | A/e | B/e | C/e | D/e | E/e | G/e | K/e | L/e | M/e | Q/e | R/e | T/e | V/e | C/m | D/m | B/m |
| f | 10001 | F (00101) | A/f | B/f | C/f | D/f | E/f | G/f | K/f | L/f | M/f | Q/f | R/f | T/f | V/f | C/r | D/r | E/r |
| g | 010101 | G (00110) | Q/v | B/g | C/g | D/g | E/g | G/g | K/g | L/g | M/g | Q/g | R/g | T/g | V/g | C/n | D/n | B/n |
| h | 100101 | H (00111) | A/h | B/h | C/h | D/h | E/h | G/h | K/h | L/h | M/h | Q/h | R/h | T/h | V/h | C/s | D/s | E/s |
| j | 101001 | J (01000) | A/j | B/j | C/j | D/j | E/j | G/j | K/j | L/j | M/j | R/j | T/j | V/j | C/u | D/u | E/u | |
| k | 000010 | K (01001) | B/k | C/k | H/k | J/k | K/k | L/k | M/k | N/k | P/k | Q/k | R/k | T/k | S/k | D/k | V/k | W/k |
| l | 001010 | L (01010) | F/l | G/l | H/l | J/l | K/l | L/l | M/l | N/l | P/l | Q/l | R/l | S/l | T/l | U/l | V/l | E/l |
| m | 010110 | M (01011) | F/m | G/m | H/m | J/m | K/m | L/m | M/m | N/m | P/m | Q/m | R/m | S/m | T/m | U/m | V/m | E/m |
| n | 100110 | N (01100) | F/n | G/n | H/n | J/n | K/n | L/n | M/n | N/n | P/n | Q/n | R/n | S/n | T/n | U/n | V/n | E/n |
| p | 101010 | P (01101) | F/p | G/p | H/p | J/p | K/p | L/p | M/p | N/p | P/p | Q/p | R/p | S/p | T/p | U/p | V/p | E/p |
| q | 000100 | Q (01110) | F/q | G/q | H/q | J/q | K/q | L/q | M/q | N/q | P/q | Q/q | R/q | S/q | T/q | U/q | V/q | W/q |
| r | 010100 | R (01111) | F/r | G/r | H/r | J/r | K/r | L/r | M/r | N/r | P/r | Q/r | R/r | S/r | T/r | U/r | V/r | W/r |
| s | 100100 | S (10000) | F/s | G/s | H/s | J/s | K/s | L/s | M/s | N/s | P/s | Q/s | R/s | S/s | T/s | U/s | V/s | W/s |
| t | 001001 | T (10001) | F/t | G/t | H/t | J/t | K/t | L/t | M/t | N/t | P/t | Q/t | R/t | S/t | T/t | U/t | V/t | W/t |
| u | 001001 | U (10010) | F/u | G/u | H/u | J/u | K/u | L/u | M/u | N/u | P/u | Q/u | R/u | S/u | T/u | U/u | V/u | W/u |
| v | 010000 | V (10011) | F/v | G/v | H/v | J/v | K/v | L/v | M/v | N/v | P/v | E/v | R/v | S/v | T/v | U/v | V/v | W/v |
| w | 100000 | W (10100) | F/w | G/w | H/w | J/w | D/w | L/w | M/w | N/w | P/w | E/w | R/w | S/w | T/w | U/w | V/w | W/w |

DATA CODING SYSTEM IN A MAGNETIC RECORDING APPARATUS

BACKGROUND OF THE INVENTION

The present invention relates to a data code conversion system for converting a binary digital data code into another binary digital data code. More particularly, the invention is concerned with a data code conversion system which can profitably be used for recording data at a high density in a magnetic recording apparatus such as a magnetic disc apparatus or the like in which signal recording on a magnetic medium is performed by inverting the direction of magnetization in accordance with a signal to be recorded. Parenthetically, the phrase "magnetic recording", is intended to encompass magnetooptical recording.

As the coding (or code conversion) system suited for use in the digital magnetic recording with a high density, there has already been proposed a so-called run length limit coding system in which a limitation is imposed on the number of binary digits or bits of "0" making appearance between the adjacent binary digits or bits of "1" in the coded data resulting from the code conversion. In practical applications, there are employed a 2-7 code system in which the number of the successive binary digits of "0" (referred to as the run length) is two at minimum and seven at maximum and a 1-7 code system in which the number of the successive binary digits of "0" is one at minimum and seven at maximum.

Typical examples of these code systems are disclosed in JP-A-48-7641 (Japanese Patent Application Laid-Open No. 7641/1973) and JP-A-58-119273.

The 1-7 coding system or the 2-7 coding system of the prior art mentioned above find extensive applications in the digital magnetic recording apparatus inclusive of the magnetic disc apparatus and others. The 2-7 coding system has a code rate of 1:2 (i.e. the conversion rate corresponding to the conversion of one bit of data into two bits of a code word), wherein a code dictionary therefor consists of seven code words having lengths represented by multiples of "2" and variable in the range of 2 to 8, inclusive thereof. Of these code words, the density of the binary digits of "1" becomes maximum in such a code word in which the bit pattern of "100" is repeated (i.e. the word in which the successive run lengths are all of 2, respectively). This maximum bit density is given by ⅓. In other words, the density or frequency at which the binary digit (bit) of "1" makes appearance in the three successive bits "100" is one. On the other hand, the density of the bits of ( "1" is minimum when the bit pattern "10000000" is repeated (i.e. when the run lengths making appearance in succession are all of 7, respectively). In this case, the density of the bit "1" is given by ⅛, meaning that the number of the bit of "1" contained in the eight successive bits of "10000000" is one. The ratio of the maximum density of the bits "1" to the minimum density thereof is obviously 8 to 3 (8:3).

The 1-7 coding system is designed for the conversion at a code rate of 2 to 3 (i.e. the rate for converting two bits of a data into three bits of a code word). In the code word obtained after this code conversion, the number of the bits "0" occurring between the adjacent bits of "1" is one at minimum and seven at maximum. There are available seven different bit patterns for the code word in this 1-7 code system.

On the other hand, in connection with reproduction of the coded data by resorting to the use of a phase synchronizing circuit in the magnetic recording apparatuses such as the magnetic disc apparatus and others, it is preferred for the reasons which will be described later on to decrease an average magnetization inverting interval rather than the maximum magnetization inverting interval while making uniform the magnetization inverting interval on an average in view of the fact that a greater phase margin can be assured.

More specifically, the run-length limited code resulting from the code conversion mentioned above is recorded in such a manner that the direction of magnetization is inverted for the binary digit value of "1" while recording of the binary digit value of "0" is performed without inverting the direction of magnetization. Upon reproduction of the coded data, a clock pulse signal is generated by a clock generating oscillation circuit in synchronism in phase with the pulse signal derived in correspondence with the inverted magnetization, wherein the individual data bits are discriminatively identified with the aid of a discriminating window prepared on the basis of the pulse interval of the clock pulse signal (which is equal to the interval between the data bits). In that case, the PLL clock generating oscillation circuit (phase-locked loop oscillation circuit) can oscillate more stably, being locked positively to the sample pulses (the pulses corresponding to the inverted magnetizations), as the average number of the pulses (the number of samples) inputted to a phase comparator incorporated in the PLL clock generating oscillation circuit is increased. Accordingly, discrimination of the reproduced data can be performed with a high reliability without involving error by virtue of the discriminating window operative on the basis of the clock pulse signal outputted from the PLL oscillation circuit mentioned above, even when the data as reproduced suffers from noise jitter. More concretely, even when the magnetization inverting interval (and hence the interval between the sample pulses) becomes transiently or temporarily longer, the clock oscillator can positively be locked in the phase to thereby oscillate in a more stable manner, as the magnetization inverting interval averaged over a plurality of data blocks becomes shorter or as variation in the average magnetization inverting interval becomes less significant. In light of the foregoing, there exists a demand for such a data coding system in which the density of the bits of "1" bringing about the inversion of magnetization upon data recording is high, the number of successive data blocks having a low density of the bits "1" (having a high density of the bits "0" to say in another way) is small and in which the density of the bits "1" averaged over a plurality of data blocks is sufficiently high without undergoing any noticeable change (i.e. at a low rate of change) even when the data block having a long magnetization inverting interval should make appearance occasionally or infrequently.

In this connection, it is noted that the 2-7 code system known heretofore suffers from a problem that the phase margin can not be increased because the density (average density) of the bits "1" changes at a relatively high rate of 8:3, as described hereinbefore.

Further, in connection with the reproduction of the coded data from a recording medium in the magnetic recording apparatus such as the magnetic disc apparatus and others, a procedure is generally adopted in which the electric signal generated upon reading the coded data is sliced at a predetermined slice level for reproducing the code words.

Figure 1A:
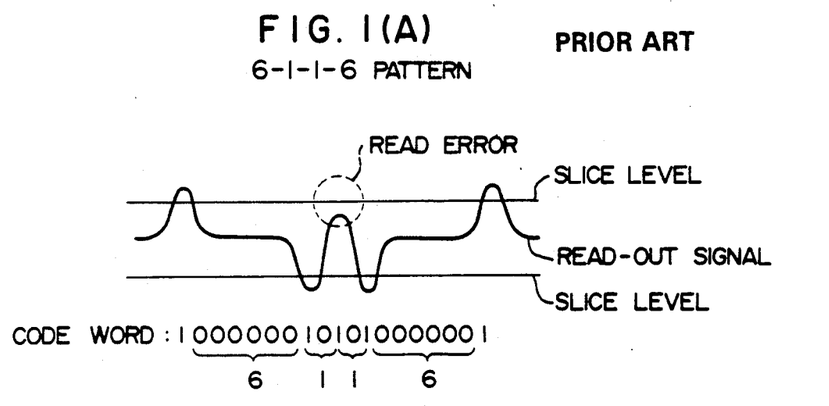
FIGS. 1(A) and 1(B) and are diagrams for illustrating the problems of the prior art data coding systems.
Figure 1B:
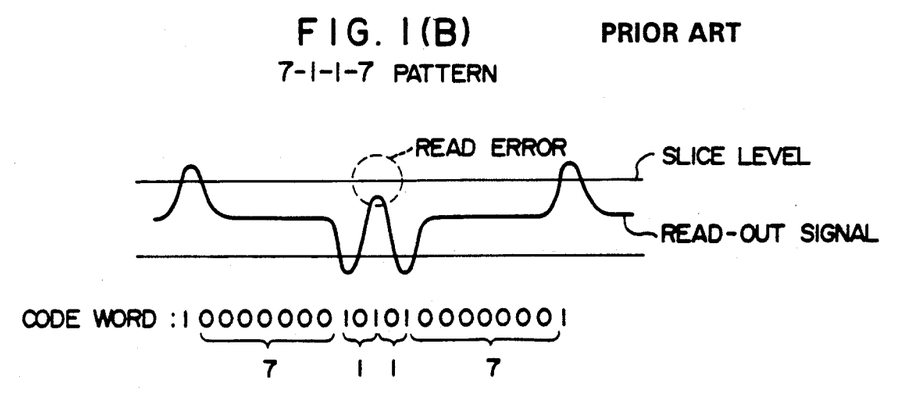

Now, let's consider the margin for the slice level employed for the read-out signal in the reproducing operation. As is illustrated in FIGS. 1(A) and 1(B) of the accompanying drawings, it has been found that the margin of the slice level for reproducing the signal of such patterns in which the number of the bits "0" (i.e. run length) occurring between the adjacent bits of "1" is 6-1-1-6 (000000101010000000) or 7-1-1-7 (0000000101010000000) for the four successive run lengths is extremely small when compared with other bit patterns. This can be explained by the fact that in the case of two patterns mentioned above, the peak level of the read-out signal varies significantly, as will be seen in FIGS. 1(A) and 1(B), because of remarkable variations in the successive run lengths (and hence the noticeable change in the rate of occurrence of the bit "1"). Therefore, a very important problem to be solved for enhancing the reliability of the magnetic recording apparatuses is how to reproduce such a pattern portion as presenting a small reading margin by resorting to an appropriate circuit design.

As will be appreciated from the above discussion, the 2-7 coding system or the 1-7 coding system known heretofore suffer a disadvantage that the margin for reading out the data is small due to the significant change in the density (rate of occurrence) of the bits "1" on an average or locally.

SUMMARY OF THE INVENTION

The present invention provides a data coding system which can overcome the problems of the prior art mentioned above and in which the density of the binary digit or bit of "1" in the code word resulting from conversion of binary data is high and in which the rate of change in the density of the bit "1" is small, while abiding by the 2-7 coding system.

The present invention also provides a 1-7 coding system in which any particular or specific bit patterns presenting a narrow reading margin, i.e. the bit patterns in which the bits of "0" occur between the adjacent bits of "1" in the run length pattern of "6-1-1-6" or "7-1-1-7" as is in the case of the prior art 1-7 coding system can positively be inhibited from making appearance. In other words, it is contemplated to provide a 1-7 code conversion system in which the number of bits of "0" occurring between the adjacent bits of "1" is one at minimum and seven at maximum, wherein the specific run length pattern presenting a narrow reading margin as mentioned above does not make appearance at all in the data pattern resulting from the code conversion or translation.

The basic concept of the present invention lies in that the number of one successive binary digits or bits of "0" (run length) occurring between the adjacent other binary digits or bits of "1" is more limited as compared with the prior art, and that local change in the density of the other binary digits of "1" is suppressed to a possible minimum.

According to a first embodiment of the present invention a code conversion system designed to abide by the 2-7 code format in which the number of one binary digits or bits "0" (run length) occurring successively between the other adjacent binary digits or bits "1" are two at minimum and seven at maximum in the code resulting from the code conversion, while the ratio of the maximum to minimum changes in the density of the other binary digits or bits "1" is suppressed to 2:1.

When the data coded according to the teaching of the present invention is divided into code blocks each having a predetermined length, the above-mentioned density change ratio between the maximum number of the bits of "1" and the minimum number thereof can be ensured in three successive code blocks selected arbitrarily.

According to a second embodiment of the present invention a data coding system in which when a data code encoded in accordance with the run length limiting method is divided into first, second and third code blocks, the bit patterns in the second and third code blocks succeeding to the first code block are limited in such a manner as mentioned below. Namely, the code word resulting from the code conversion in accordance with the same bit array rule as adopted in the conventional 1-7 coding system is prepared such that the number of the bits of "0" occurring between the adjacent bits of "1" is one at minimum and seven at maximum, wherein the run length patterns of 6-1-1-6 (000000101010000000) and 7-1-1-7 (0000000101010000000) are inhibited from making appearance in the bit pattern of four successive run lengths.

The data coding systems mentioned above bring about advantageous effects as follows.

When the data resulting from the code conversion by the data coding system according to the first embodiment of the invention is divided into code blocks each having a predetermined length, the change ratio between the maximum and minimum numbers of the binary digits or bits of "1" mentioned hereinbefore is ensured in the three successive blocks selected arbitrarily. More specifically, assuming that a single code block resulting from the code conversion consists of six bits, it is ensured that the number of the binary digits or bits of "1" occurring in the three successive blocks of 18 bits in total is six at maximum and three at minimum.

Since change in the density of the binary digits of "1" in the code resulting from the code conversion can be limited to a small maximum/minimum change ratio of 2:1 when compared with the density change ratio of 8:3 in the coding system known heretofore, data discrimination can be performed accurately with a clock signal generated on the basis of the binary digits of "1" upon data reproduction without involving error, whereby the noise margin can be increased.

Similarly, when the code data resulting from the code conversion by the data coding system according to the second embodiment of the invention is divided into code blocks each having a predetermined length, it is observed that the run length pattern causing the margin for the signal reading to be significantly decreased, i.e. the 6-1-1-6 pattern or 7-1-1-7 pattern can never occur within eighteen bits in any combinations of three successive code blocks selected arbitrarily.

Because of absence of any bit pattern which causes the slice level margin to be reduced upon reproduction of the coded data from a recording medium, operation margin of the magnetic recording apparatus can significantly be increased in the data reproduction.

DETAILED DESCRIPTION

Now, the preferred and exemplary embodiments of the present invention will be described in detail with reference to the drawings.

In the first place, a data coding system according to a first embodiment of the invention will be described by referring to FIGS. 2 to 5.

Figure 3A:
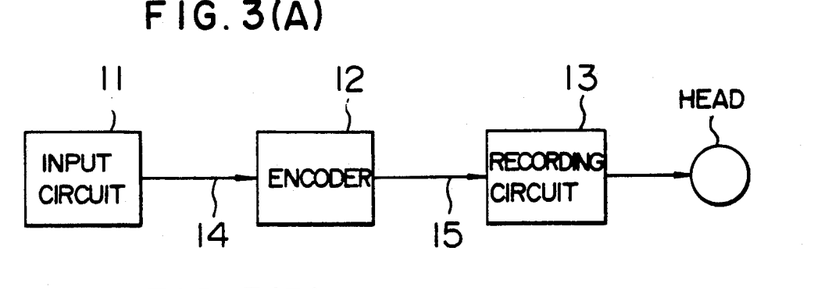
FIG. 3(A) is a block diagram showing only schematically a general arrangement of a magnetic data recording system according to a first embodiment of the present invention.
Figure 3B:
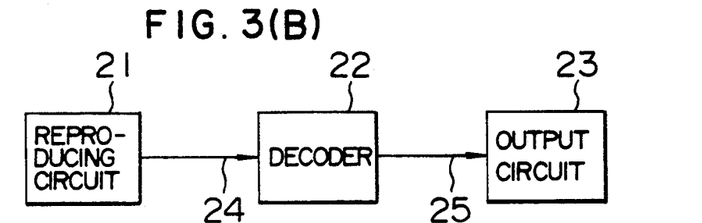
FIG. 3(B) is a block diagram showing a general arrangement of a magnetic data reproducing system according to the first embodiment of the present invention.

FIG. 3(A) is a block diagram showing only schematically a general arrangement of a magnetic data recording system incorporating a data coding circuit (encoder) for recording of data on a recording medium, and FIG. 3(B) is a block diagram showing only schematically a general arrangement of a magnetic data reproducing system for reproducing the coded data from a recording medium. In FIG. 3(A), a reference numeral 11 denotes an input circuit, 12 denotes an encoder (data coding circuit) and 13 denotes a recording (writing) circuit. The output signal of the recording circuit 13 is supplied to a recording head, HEAD. In FIG. 3(B), reference numeral 21 denotes a reproducing circuit, 22 denotes a decoder and 23 denotes an output circuit.

Figure 2A:
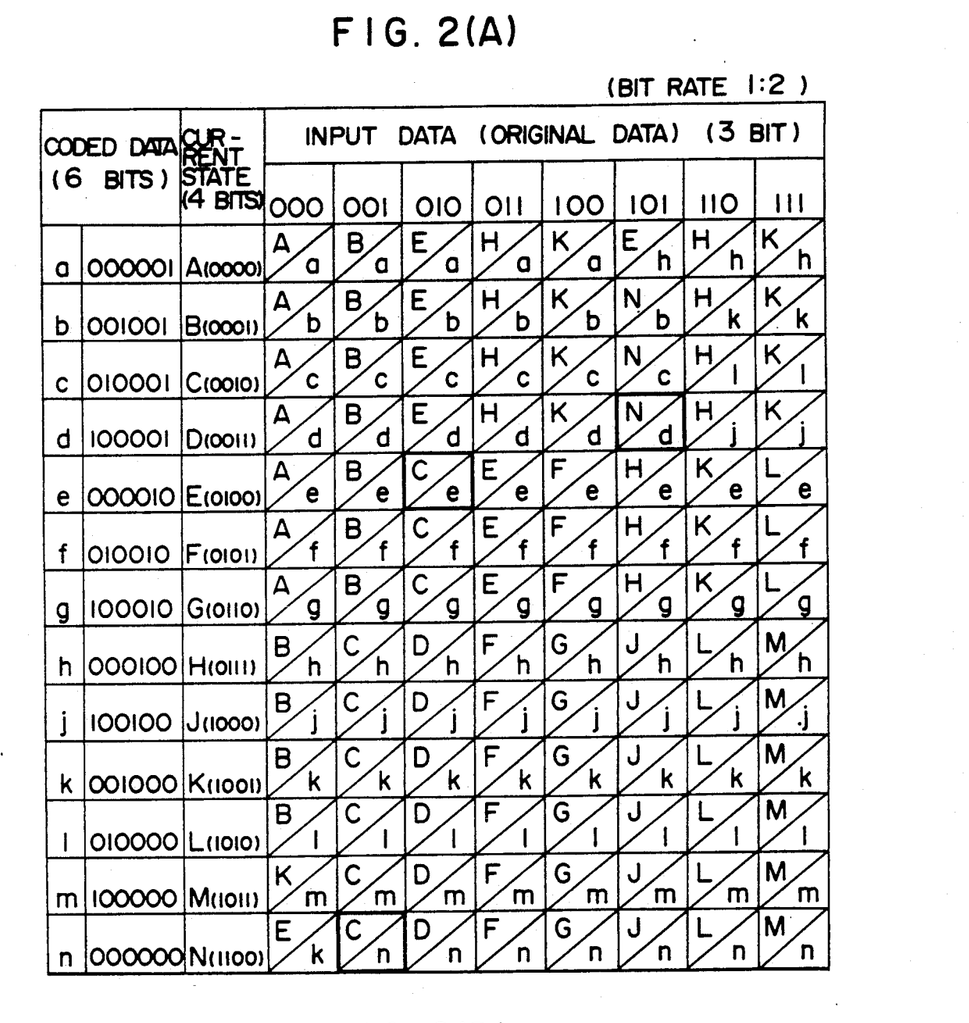
FIG. 2(A) shows a state transition table stored in a read-only memory incorporated in a next-state output logic circuit shown in FIG. 4 for illustrating the principle underlying a first embodiment of the data coding system according to the present invention.
Figure 2B:
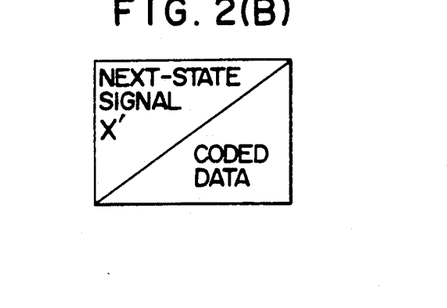
FIG. 2(B) is a view for illustrating a combination of next-state signal and coded data stored in the above-mentioned read-only memory at an address thereof.
Figure 4:
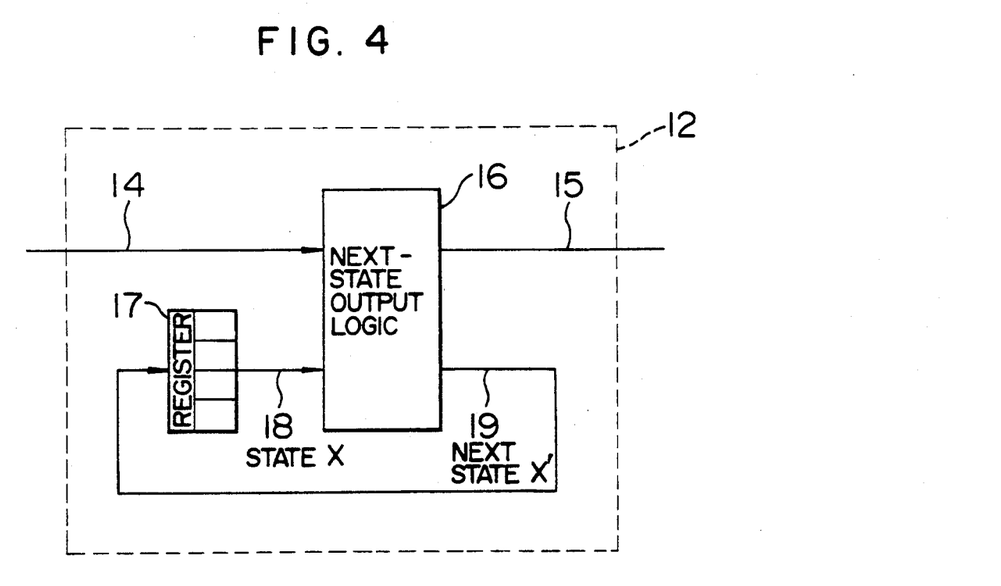
FIG. 4 is a schematic circuit diagram showing a circuit configuration of an encoder (data coding circuit) shown in FIG. 3(A).

The encoder 12 according to a first aspect of the invention is so designed as to have a function for coding (converting) the original data 14 to be recorded to thereby output a code word signal 15. To this end, the encoder 12 is composed of a register 17 and a next-state output logic circuit 16, as is shown in FIG. 4. The original data 14 (consisting of three bits) is inputted to the next-state output logic circuit 16 together with a current-state signal X (consisting of four bits) from the register 17, whereby the input data are converted into a coded data 15 (consisting of six bits) and a next-state signal X' to be subsequently outputted, as indicated by a reference numeral 19. Such code conversion or translation can be realized by incorporating a read-only memory (ROM) in the logic circuit 16 and writing in the ROM at an address thereof determined by the original data 14 and the state signal X the code word (coded data) 15 and the next-state signal X' corresponding to the above-mentioned address. The next-state signal X' is made use of as the current-state signal X upon conversion (translation) of a succeeding or next code block. FIG. 2(A) shows a state transition table of the input data (original data) stored in the ROM. More specifically, all possible combinations of the original data 14 and the state signals 18 inputted to the logic circuit 16 are determined, wherein the next-state signals X' and the coded data (code words) 15 are listed in the table shown in FIG. 2(A) in accordance with the combinations thus determined. An example of a combination of one of the next-state signals X', represented by capital alphabet letters, and one of the coded data (code words) represented by small alphabet letters is illustrated in FIG. 2(B). Referring to FIG. 2(A) in combination with FIG. 2(B) and assuming, by way of example only, that the input data is "001" with the state signal (current state signal) X being "A (0000)", it can be readily seen that the next-state (succeeding-state) signal X' is "B (0001)" and the coded data is "a (000001)". By combining the input data with the state signal X'(B) outputted precedently as the current state signal X, there can be obtained the state signal and the coded data. This procedure may be repeated successively.

Figure 5:
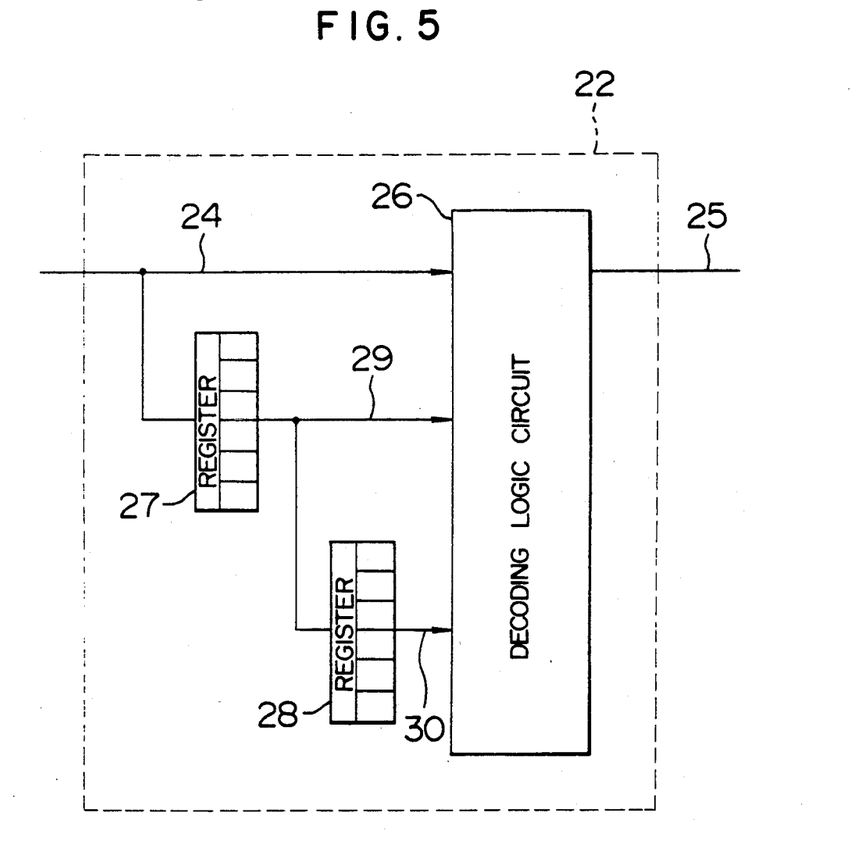
FIG. 5 is a schematic circuit diagram showing a circuit configuration of a decoder employed in the data reproducing system shown in FIG. 3(B).

The data reproducing system shown in FIG. 3(B) serves for reproducing the coded data 24 (consisting of six bits) read out from a recording medium, wherein the coded data 24 is decoded into the original data 25 by means of a decoder 22. The reproducing circuit 21 includes a phase-controlled type clock generator constituted by a voltage-controlled oscillator (VCO) and a phase comparator, wherein data pulses are discriminated with the aid of a discriminating window prepared on the basis of the clock signal outputted from the clock generator. FIG. 5 shows a circuit configuration of the decoder 22. In the case of the decoder 22, the state signal processing as required in the encoder 12 described above is rendered unnecessary. The coded data 29 reproduced and passed through a register 27 is inputted to a decoding logic circuit 26 simultaneously with preceding and succeeding coded data (code words) 30 and 24, respectively, whereby the data are decoded through the processing procedure reverse to that described above in conjunction with FIG. 3(A). More specifically, the decoding logic circuit 26 incorporates therein a ROM which outputs the original data 25 on the basis of the combination of three successive coded data 24, 29 and 30 by using these data as address information. The state transition table for the ROM can be derived from the table shown in FIG. 2(A) through reverse procedure. By way of example, let's assume that the coded data 30, 29 and 24 are represented by "d (100001)", "n (000000)" and "c (010001)", respectively. Then, data "101" is decoded as the original data in correspondence with the symbols shown in thick line frames in the table shown in FIG. 2(A). When the coded data 30, 29 and 24 are, respectively, "n", "c" and "e (000010)" at the succeeding time point, the original data "001" is decoded through similar procedure.

According to the illustrated embodiment of the inventive coding system, the number of the bits "1" in the coded data becomes maximum when coded data "b" make an appearance in three successive blocks or when coded data "f" make appearance in three successive blocks or when coded data "j" make appearance in three successive blocks. In other words, the number of the bits "1" becomes maximum when the pattern "001" is repeated. By the way, the coded data such as, for example, "c", "d" and "g" are not repeated successively over three blocks. Since six bits "1" are present in the eighteen bits constituting the three successive code blocks, the density of the bits of "1" is given by 6/18=⅓. The density higher than this can never occur in any combinations.

On the other hand, the number of the bits "1" in the coded data becomes minimum, when no more than three bits of "1" occur in the three successive blocks, i.e. in the eighteen bits. In this case, the density of the bits of "1" is given by 1/6. By way of example, when the coded data "a", "e", "1" or "m" is repeated in three successive blocks, i.e. when the pattern "000001" is repeated, the number of the bits of "1" becomes minimum. In any of these coded data, one code block consisting of six bits contains one binary digit of "1" at minimum. When the coded data "n" having six bits all of "0" is generated, the coded data immediately preceding to the data "n" is limited to one of the coded data "b", "c" and "d" for each of which the input data is "101" and each containing two bits each of "1". Accordingly, the density averaged over three blocks (18 bits) is at least 3/18=1/6. Upon starting of the coding operation, the register 17 shown in FIG. 4 is reset to thereby inhibit the first state signal from becoming the signal N for preventing the coded data "n" (having six bits each of "0") from being generated at first. Thus, whenever the coded data consisting of six bits each of "0" is generated, the one code block immediately preceding thereto has always two bits each of "1" in the six bits.

As will be appreciated from the above elucidation, the three successive code blocks consisting of eighteen bits in total have three bits of "1" at minimum and thus ensure the density of 1/6.

In other words, the ratio of the maximum/minimum change in the density of the bit "1" in the code resulting from the code conversion is 2:1, which ratio is obviously small when compared with the ratio of maximum/minimum density change of 8:3 in the case of the prior art 2-7 coding system.

In addition to the succession of the data blocks "b", "f" or "j" mentioned above, the run length also assumes locally the minimum value when two data blocks mentioned below succeed to each other. In that case, the run length at the boundary of the two blocks assumes the minimum value of two. For example, the run length assumes the minimum value in the succession of blocks "a" and "b" (the case where the current state is "A", the first input data is "001" and the succeeding input data is one of "000" to "101") and in the succession of blocks "a" and "k" (the case where the current state is "A", the first input data is "100" and the succeeding input data is one of "000" to "111"). Similarly, the minimum run length makes appearance in the block successions of b - b, b - k, c - b, c - k, d - b, d - k, e - c, e - f, e - l, f - c, f - f, f - l, g - c, g - l, h - g, h - j, h - m, j - d, j - g and j - m. In any of these block successions, the minimum run length at the block boundary is two. On the other hand, the maximum run length takes place in the block succession of k - e (the case where the current state is "N", the first input data is "000", and the succeeding input data is one of "000" to "111") and the block successions of m - k, m - c, n - f and n - 1, respectively. In this case, the run length is seven. As will be seen, the codes shown in FIG. 2A abide by the 2-7 coding format.

As will now be understood, in the data coding system according to the illustrated embodiment of the present invention, the ratio of maximum/minimum change in the density of the code bits "1" is 2:1, while abiding by the conventional 2-7 coding format, which ratio is smaller than the corresponding ratio of 8:3 in the conventional 2-7 code. Thus, with the data coding system according to this embodiment, the phase synchronizing circuit of the clock pulse generator for discriminating the data codes upon reproduction thereof can be implemented in a circuit structure having a large margin for jitter noise.

Figure 6:
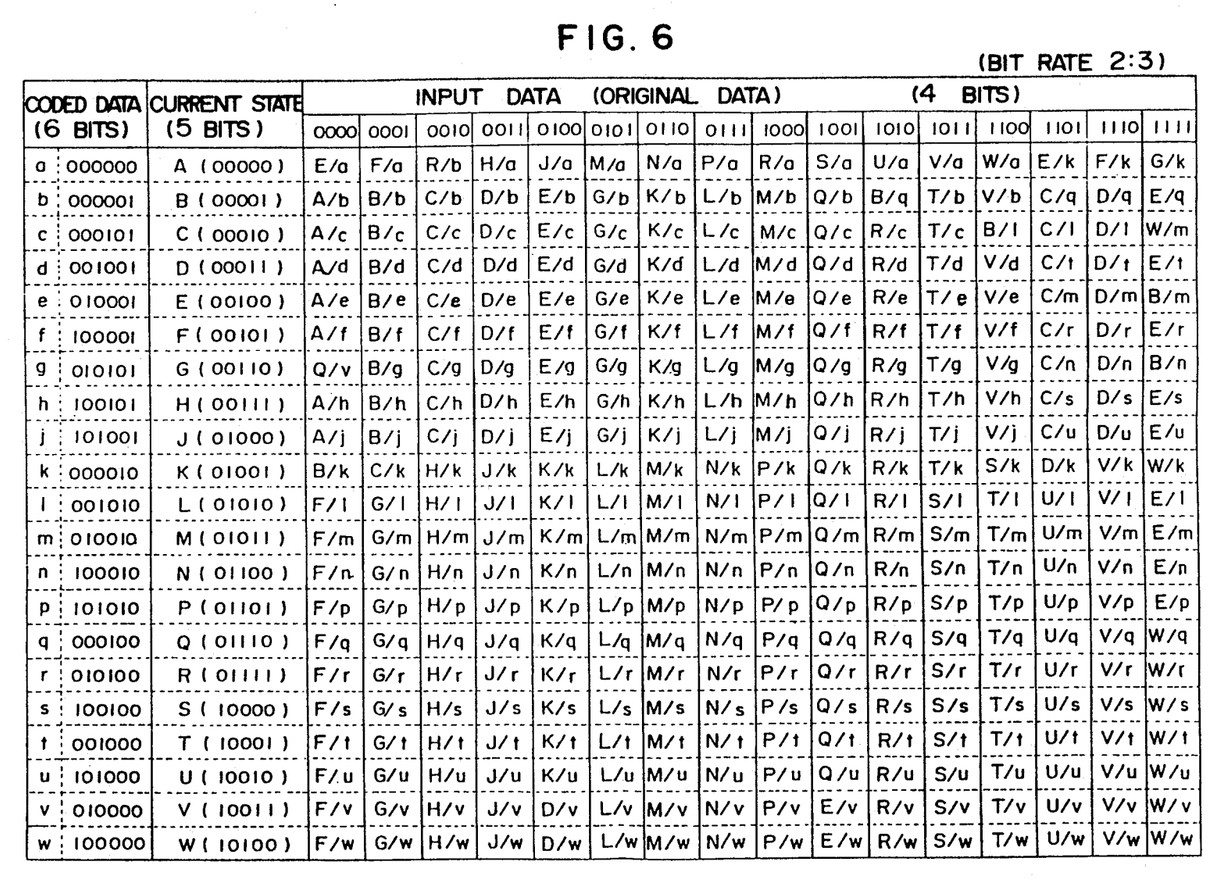
FIG. 6 is a view showing a table for illustrating the principle underlying a second embodiment of the data coding system according to the invention.

Next, a second embodiment of the invention will be described by referring to FIG. 6. The table shown in this figure can be read in the same manner as described hereinbefore in conjunction with FIGS. 2(A) and 2(B). The coding circuit and the decoding circuit employed are similar to those shown in FIGS. 3 and 4, respectively. Accordingly, any further description of these circuits will be unnecessary. The differences from the first embodiment described hereinbefore reside in that the input data (original data) 14 is of four bits, the current state (X) inputted from the register 17 is of five bits and that the output coded data 15 is of six bits. Accordingly, the code conversion as well as reverse conversion can be performed correspondingly in light of the description concerning the first embodiment.

In the data coding system according to the instant embodiment, the decoded data pattern approximates most closely to the pattern "6-1-1-6" shown in FIG. 1(A) or the pattern "7-1-1-7" shown in FIG. 1(B), when the coded data of a - p - k is produced in response to the input data having the state signal changing from "A" to "P" and then to "K". The run length pattern is "6-1-1-5". For the input data having the state signal changing from "W" to "L" and thence to "F", the output data changes from "w" to "1" and thence to "f" and has the run length pattern of "7-1-1-4". For the input data having the state signal changing from "W" to "G" and thence to "B", the coded data changes from "w" to "g" and then to "b", wherein the run length pattern of the bits of "0" occurring between the adjacent bits of "1" is up to "6-1-1-5". With any other combinations of the state signals, a combination of the coded patterns which approximates more closely to the specific run length pattern "6-1-1-6" or "7-1-1-7" can never occur.

As will now be appreciated, by using the state transition table shown in FIGS. 2(A) and 2(B), the 1-7 code conversion system is abided by in which the number of the bits "0" occurring between the adjacent bits of "1" is one at minimum and seven at maximum and in which no specific run length pattern of "6-1-1-6" or "7-1-1-7" will appear in the data pattern resulting from the code conversion or translation.

In the coding system according to the second embodiment of the invention, no change takes place in the peak level in the reproducing operation because the density or frequency at which the bit of "1" appears is prevented from locally changing remarkably, whereby the margin can be positively protected against any degradation.

As will be appreciated from the foregoing description, in the data coding system according to the invention, the original data can be converted or translated into a 2-7 code word while abiding by the conventional 2-7 coding scheme, wherein the ratio of maximum/minimum change in the density of one of the binary digits can be reduced from 8:3 to 2:1. Thus, discrimination of the coded data can be performed with a high reliability without involving error even when the coded data suffers from an occurrence of jitter, whereby the margin of the discriminating circuit for the noise jitter can be increased.

Further, in the code word resulting from the code conversion of the original data into the 1-7 code, the slice level margin for the reproduction of the coded data can be increased while abiding by the conventional 1-7 coding scheme, because of absence of the coded data pattern presenting a narrow margin for the signal read-out upon reproduction such as the coded data in which the number of bits each of "0" occurring between the adjacent bits of "1" presents the run length pattern of "6-1-1-6" or "7-1-1-7".

In the foregoing description of the preferred embodiments of the invention, it has been assumed that the code conversion is applied to the magnetic recording in which the signal recording on a magnetic medium is realized by inverting the direction of magnetization on the medium in response to the binary digit of "1". However, the invention is not restricted to such magnetic recording but can equally be applied to the recording in which the direction of magnetization is changed over with the binary digit of "0". Further, the magnetic recording based on the principle of the invention can equally be applied to other type of magnetic recording such as magnetooptical recording.

What is claimed is:

1. A data encoding device for a magnetic recording apparatus comprising:
   means for inputting original data, said original data comprising a plurality of digital bits;
   means for storing a state transition table which accepts original data and current state data and outputs coded data and next state data based on said original data, said current state data, and contents of said state transition table;
   means for accepting and storing said next state data and for later providing the stored data as current state data to said means for storing a state transition table; and
   means for supplying a coded data to a recording head,
   wherein said means for storing a transition table converts said original data such that one of binary digits "1" and "0" occurs in a number of two at minimum and seven at maximum between adjacent ones of the other binary digits wherein a ratio between maximum and minimum values of density at which said other binary digit appears is 2:1.

2. A data coding system according to claim 1 wherein said other binary digits make appearance in a number of at least three bits in eighteen consecutive bits of the binary code resulting from said conversion.

3. A data coding system according to claim 2, wherein said other binary digit is "1" and said one binary digit is "0".

4. A data coding system according to claim 1, wherein said other binary digit is "1" and said one binary digit is "0".

5. A data coding system in a magnetic recording apparatus for converting two bits of a binary digital data into three bits of a run length limited code in which one of binary digits "1" and "0" occurs in a number of one at minimum and seven at maximum between adjacent ones of the other binary digits and in which among various run length patterns including four run lengths, the run length patterns of "6-1-1-6" and "7-1-1-7" with which error is likely to take place in a signal read out upon data reproduction are inhibited from making appearance.

6. A data coding system according to claim 5, wherein among the various run length patterns constituted by four run lengths, the run length patterns in which occurrence of the maximum run length and the minimum length changes most remarkably are limited up to the run length patterns of "6-1-1-5" and "7-1-1-4" inclusive thereof.

7. A data coding system according to claim 5, wherein said other binary digit is "1" and said one binary digit is "0".

8. A data coding system according to claim 6, wherein said other binary digit is "1" and said one binary digit is "0".

9. A digital signal conversion system in a magnetic recording apparatus for converting one bit of an input digital signal into a signal of two bits, in which the number of binary digits of "0" making appearance between adjacent binary digits of "1" is two at minimum and seven at maximum, wherein in the digital signal resulting from the conversion, ratio between maximum and minimum values of density at which said binary digit of "1" makes appearance is 1:2.

10. A digital signal conversion system in a magnetic recording apparatus for converting two bits of an input digital signal into a signal of three bits, in which the number of binary digits of "0" making appearance between adjacent binary digits of "1" is one at minimum and seven at maximum, wherein in a digital code block of four run lengths in a digital signal resulting from the code conversion, the run length pattern in which occurrence of the maximum and minimum numbers of the binary digits of "0" between said adjacent binary digits of "1" changes most remarkably are limited up to the run length patterns of "6-1-1-5" and "7-1-1-4" inclusive thereof.

11. A magnetic recording and reproducing apparatus comprising:
    a clock pulse generating circuit;
    means for providing original binary data;
    a magnetic head, controlled by a binary input signal and having a magnetic field, wherein said magnetic field is inverted at various intervals in response to a binary signal "1" in the binary input signal;
    means for decreasing variation in the intervals; and
    means for preventing the intervals from becoming less then a predetermined minimum value.

12. The magnetic recording and reproducing apparatus of claim 11 wherein,
    said means for decreasing variation in the intervals maintains a ratio of 2:1 between the maximum and minimum density values of "1" in the input binary data and
    said means for preventing the intervals from becoming less then a predetermined minimum value converts each bit of the original binary data into two bits thereby creating input binary data having a minimum of two "0"s and a maximum of seven "0"s between adjacent "1"s.

13. The magnetic recording and reproducing apparatus of claim 12 wherein,
    a single means comprises said means for decreasing variation in the intervals and said means for preventing the intervals from becoming less than a predetermined minimum value.

14. The magnetic recording and reproducing apparatus of claim 13 wherein:

said clock pulse generating circuit generates a clock pulse signal in phase with a pulse signal corresponding to magnetic field inversions of the magnetic head.

15. The magnetic recording and reproducing apparatus of claim 13 wherein, the binary values of "0" and "1" are inverted.

16. The magnetic recording and reproducing apparatus of claim 12 wherein:
    said clock pulse generating circuit generates a clock pulse signal in phase with a pulse signal corresponding to magnetic field inversions of the magnetic head.

17. The magnetic recording and reproducing apparatus of claim 12 wherein, the binary values of "0" and "1" are inverted.

18. A magnetic recording and reproducing apparatus comprising:
    a clock pulse generating circuit;
    means for providing original binary data;
    a magnetic head, controlled by a binary input signal and having a magnetic field, said magnetic field is inverted at various intervals in response to a binary signal "1" in the binary input signal;
    means for decreasing the length of the intervals; and
    means for inhibiting the binary input signal from having run length patterns of "6-1-1-6" and "7-1-1-7".

19. The magnetic recording and reproducing apparatus of claim 18 wherein,
    said means for decreasing the length of the intervals converts every two bits of the original binary data into three bits thereby creating a binary signal having a minimum of one "0" and a maximum of seven "0"s between adjacent "1"s.

20. The magnetic recording and reproducing apparatus of claim 19 wherein,
    a single means comprises said means for decreasing the length of the intervals and said means for inhibiting the binary input signal from having run length patterns of "6-1-1-6" and "7-1-1-7".

21. The magnetic recording and reproducing apparatus of claim 20 wherein:
    said clock pulse generating circuit generates a clock pulse signal in phase with a pulse signal corresponding to magnetic field inversions of the magnetic head.

22. The magnetic recording and reproducing apparatus of claim 20 wherein, the binary values of "1" and "0" are inverted.

23. The magnetic recording and reproducing apparatus of claim 19 wherein:
    said clock pulse generating circuit generates a clock pulse signal in phase with a pulse signal corresponding to magnetic field inversions of the magnetic head.

24. The magnetic recording and reproducing apparatus of claim 19 wherein, the binary values of "1" and "0" are inverted.

* * * * *